United States Patent
Zhang et al.

(10) Patent No.: US 12,490,441 B2
(45) Date of Patent: Dec. 2, 2025

(54) TUNNELING-BASED SELECTORS INCORPORATING VAN DER WAALS (vdW) MATERIALS

(71) Applicant: TetraMem Inc., Fremont, CA (US)

(72) Inventors: Minxian Zhang, Amherst, MA (US); Ning Ge, Danville, CA (US)

(73) Assignee: TetraMem Inc., San Jose, CA (US)

(*) Notice: Subject to any disclaimer, the term of this patent is extended or adjusted under 35 U.S.C. 154(b) by 870 days.

(21) Appl. No.: 17/746,685

(22) Filed: May 17, 2022

(65) Prior Publication Data

US 2023/0380189 A1     Nov. 23, 2023

(51) Int. Cl.
*H10B 63/00*     (2023.01)

(52) U.S. Cl.
CPC .................................. *H10B 63/20* (2023.02)

(58) Field of Classification Search
CPC ......... H10B 63/20; H10B 63/80; H10N 70/00
See application file for complete search history.

(56) References Cited

U.S. PATENT DOCUMENTS

| | | | |
|---|---|---|---|
| 2017/0047223 A1* | 2/2017 | Wang | H10D 62/85 |
| 2021/0083133 A1* | 3/2021 | Efetov | G01J 1/0209 |
| 2021/0249539 A1* | 8/2021 | Zhu | H10D 64/689 |

FOREIGN PATENT DOCUMENTS

| | | |
|---|---|---|
| JP | 2011150522 | 8/2011 |
| JP | 2020205405 | 12/2020 |
| JP | 2021150522 A | 9/2021 |

* cited by examiner

*Primary Examiner* — Mounir S Amer
(74) *Attorney, Agent, or Firm* — Jaffery Watson Hamilton & DeSanctis LLP

(57) ABSTRACT

In accordance with some embodiments of the present disclosure a tunneling-based selector is provided. The selector includes a multilayer barrier structure fabricated between a first electrode and a second electrode. The multilayer barrier structure includes a first layer of a first van der Waals (vdW) material; a second layer of a second vdW material; and a third layer of a third vdW material. The first layer of the first vdW material is fabricated between the second layer of the second vdW material and the third layer of the third vdW material. The electron affinity of the first layer of the first vdW material is lower than the second electron affinity of the second layer of the second vdW material and the electron affinity of the third layer of the vdW material.

20 Claims, 13 Drawing Sheets

TUNNELING-BASED SELECTORS INCORPORATING VAN DER WAALS (vdW) MATERIALS

TECHNICAL FIELD

The implementations of the disclosure relate generally to selector devices and, more specifically, to tunneling-based selectors incorporating van der Waals (vdW) materials.

BACKGROUND

High-density memory and computing devices, such as crossbar circuits including a circuit structure with interconnecting electrically conductive lines sandwiching a resistive switching material at their intersections, require each memory cell to be paired with a selector device to enable reading and writing a selected memory cell. For example, a crossbar circuit may utilize a one-selector-one-resistor (1S1R) structure including a selector device (e.g., a transistor) serially connected to a memory cell to select particular memory cells for performing a read or write operation and to suppress undesirable leakage currents passing through unselected memristors.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In accordance with some embodiments of the present disclosure, a tunneling-based selector is provided. The selector includes a multilayer barrier structure fabricated between a first electrode and a second electrode. The multilayer barrier structure includes a first layer of a first van der Waals (vdW) material; a second layer of a second vdW material; and a third layer of a third vdW material. The first layer of the first vdW material is fabricated between the second layer of the second vdW material and the third layer of the third vdW material. The electron affinity of the first layer of the first vdW material is lower than the second electron affinity of the second layer of the second vdW material and the electron affinity of the third layer of the vdW material.

In some embodiments, the first layer comprising the first vdW material is fabricated between the second layer comprising the second vdW material and the third layer comprising the third vdW material.

In some embodiments, the first vdW material comprises h-BN. The second vdW material comprises at least one of $MoS_2$, $WS_2$, or $WSe_2$. The third vdW material comprises at least one of $MoS_2$, $WS_2$, or $WSe_2$.

In some embodiments, the first vdW material comprises $WSe_2$. The second vdW material comprises at least one of $MoSe_2$, $MoS_2$, or $HfS_2$. The third vdW material comprises at least one of $MoSe_2$, $MoS_2$, or $HfS_2$.

In some embodiments, the multilayer barrier structure further comprises a fourth layer of a fourth vdW material. The second electron affinity of the second vdW material is lower than a fourth electron affinity of the fourth vdW material.

In some embodiments, the fourth layer of the fourth vdW material is fabricated between the second layer comprising the second vdW material and the first electrode.

In some embodiments, the multilayer barrier structure further comprises a fifth layer of a fifth vdW material. The third electron affinity of the third layer of the third vdW material is lower than a fifth electron affinity of the fifth layer of the fifth vdW material.

In some embodiments, the fifth layer of the fifth vdW material is fabricated between the third layer comprising the third vdW material and the second electrode.

In some embodiments, the multilayer barrier structure comprises 2n+1 layers of vdW materials, wherein n is a positive integer.

In some embodiments, the multilayer barrier structure forms a staircase tunnel barrier approximating a triangular tunnel barrier. The multilayered structure may or may not be symmetrical about its center layer.

In some embodiments, a ratio of a first current passing through the selector responsive to a first voltage to a second current passing through the selector responsive to a second voltage is not less than $10^2$, wherein the second voltage is half of the first voltage.

In some embodiments, the ratio is not less than $10^5$.

In some embodiments, the ratio is not less than $10^7$.

In some embodiments, the selector has a staircase tunnel barrier approximating a triangular tunnel barrier.

According to one or more aspects of the present disclosure, an apparatus is provided. The apparatus includes the selector and a memory device serially connected to the selector.

In some embodiments, wherein the memory device comprises a switching oxide layer comprising at least one of HfOx or TaOy, wherein x≤2.0, and wherein y≤2.5.

In some embodiments, the memory device comprises at least one of a memristor, resistive random-access memory (RRAM), phase-change memory (PCM), floating gates, spintronic devices, dynamic random-access memory (DRAM), ferroelectric random-access memory (FeRAM), or static random-access memory (SRAM).

In some embodiments, the apparatus further comprises the first electrode and the second electrode.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding.

DETAILED DESCRIPTION

Figure 1:
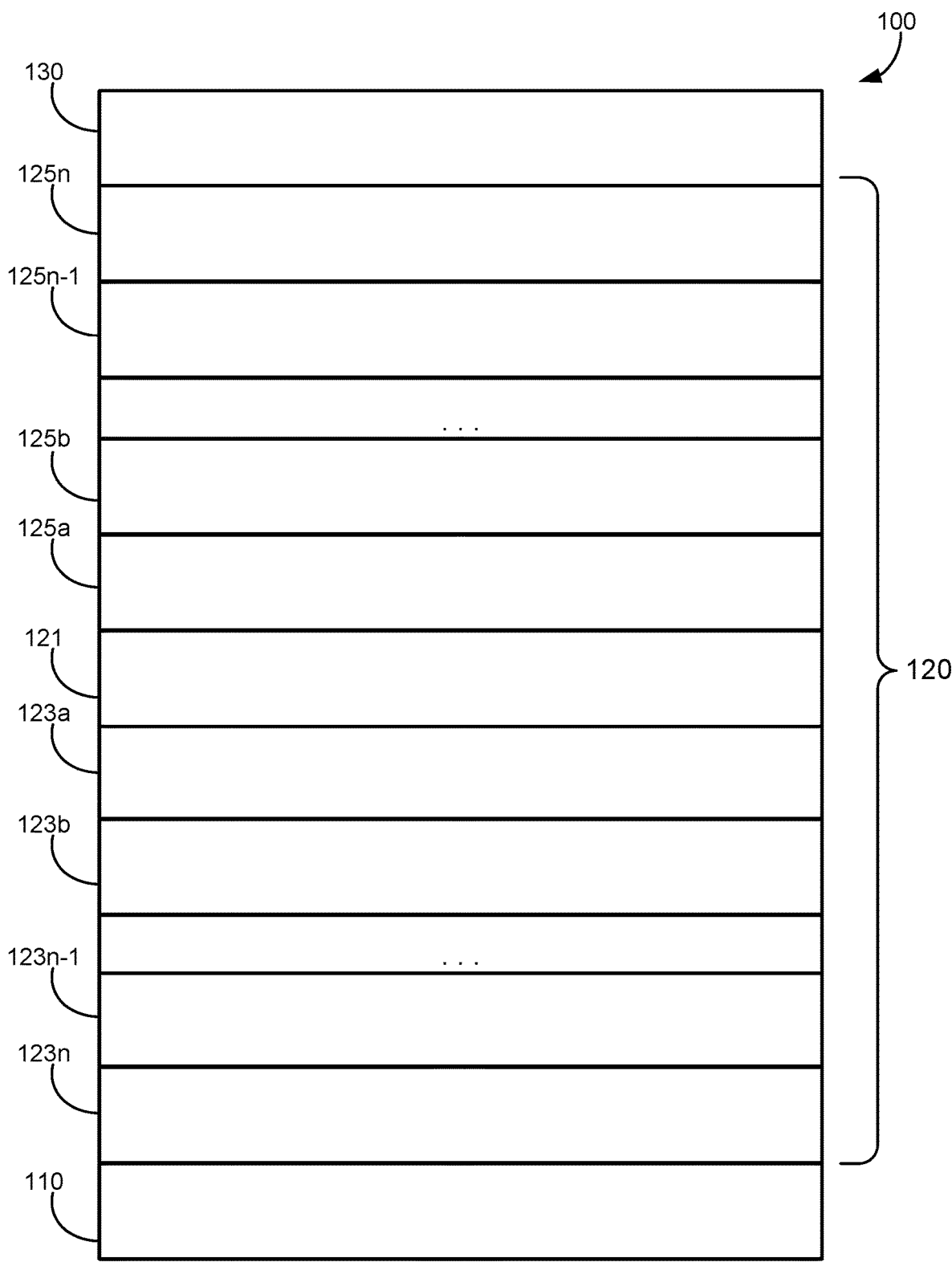
FIG. 1 is a schematic diagram illustrating a cross-sectional view of an example selector in accordance with some embodiments of the present disclosure.

Aspects of the disclosure provide tunneling-based selectors incorporating van der Waals (vdW) materials and mechanisms for fabricating the selectors. As used herein, vdW materials may refer to two-dimensional (2D) materials having van der Waals heterostructures. A vdW material may include strongly bonded 2D layers (one-atom-thick sheets) that are stacked together via van der Waals interactions and can be exfoliated into thin 2D free-standing layers. Examples of vdW materials include $SnS_2$ (tin sulfide), $ZrS_2$ (zirconium sulfide), $SnSe_2$ (stannic selenide), $HfS_2$ (hafnium disulfide), $MoS_2$ (molybdenum disulfide), $MoSe_2$ (molybdenum diselenide), $MoTe_2$ (molybdenum ditelluride), $WS_2$ (tungsten disulfide), $WSe_2$ (tungsten diselenide), graphene (Gr), h-BN (Hexagonal boron nitride), etc.

Memory and computing devices, such as memristor-based crossbar arrays, may require selector devices to select particular memory and/or computing elements and suppress undesirable sneaking currents passing through the partially selected or unselected memory and/or computing elements. While transistors are widely used as selectors in crossbar arrays, third-terminal transistor-based selectors are not ideal for crossbar arrays as their large footprints may limit array density and increase costs. As such, it might be desirable to use two-terminal selectors that may be scaled laterally and stacked vertically together with a memory cell (e.g., a memristor) to implement crossbar arrays. However, conventional two-terminal selectors do not possess certain desirable characteristics required for implementing crossbar arrays and similar computing and/or memory applications, such as high nonlinearity, high endurance, a sufficient current density, and small variance from device to device.

The present disclosure provides tunneling-based selectors with a multilayer staircase tunneling barrier to approximate a desirable triangular tunnel barrier. The selectors can be used in memory applications and computing applications, such as in-memory computing applications, non-volatile solid-state memory, image processing applications, neural networks, etc.

According to one or more aspects of the present disclosure, a selector may include a first electrode, a second electrode, and a multilayer barrier structure fabricated between the first electrode and the second electrode. The first electrode and the second electrode may include graphene or any other material with suitable electrical conductivity.

The multilayer barrier may include multiple layers of van der Waals (vdW) materials and may form a staircase tunneling barrier to approximate a triangular tunnel barrier. The multilayer barrier structure may include a central layer of a first VDW material sandwiched between layers of VDW materials having higher electron affinities than the first VDW material. The multilayer barrier structure may include any suitable number of layers of vdW materials (e.g., 2n+1 layers, where n is a positive integer), where the electron affinity of an inner layer in the multilayer barrier structure is lower than that of its adjacent outer layer, where the inner layer is closer to the central layer than the outer layer. As an example, the multilayer barrier structure may include a layer of h-BN sandwiched between two layers of $MoS_2$. As another example, the multilayer barrier structure may include a layer of h-BN sandwiched between two layers of $WS_2$. As a further example, the multilayer barrier structure may include a layer of h-BN sandwiched between a first layer of $WSe_2$ and a second layer of $WSe_2$. The multilayer barrier structure may further include a first layer of $MoS_2$ fabricated between the first layer of $WSe_2$ and the first electrode and a second layer of $MoS_2$ fabricated between the second layer of $WSe_2$ and the second electrode.

The multilayer barrier structure may approximate a triangular tunnel barrier with a height peak in the middle of the energy barrier. An electric field may reduce the peak barrier height of the triangular tunnel barrier compared to the case of a rectangular or uniform tunnel barrier where the barrier width may be reduced. However, the barrier height may not be reduced with an external voltage as possessed by many existing tunneling-based selector devices. Therefore, the tunneling current through the triangular tunnel barrier may change abruptly responsive to an electric field applied to the selector, resulting in high nonlinearity of the selector. The nonlinearity of the selector may be measured by a nonlinearity factor representative of a ratio of the current passing through the selector at a threshold voltage for switching the selector to a conductive state and the current passing through the selector at half of the threshold voltage. The nonlinearity factor of the selector may exceed $10^7$ in some embodiments.

The selectors described herein also exhibit high endurance (e.g., remaining functional as designed after at least $10^8$ applications of read or write voltages), excellent uniformity, and good thermal stability. The selectors may provide a sufficient drive current density (e.g., a current density greater than $10^6$ µA/cm2) for implementing many memory applications or computing applications. The selectors described herein may thus enable high-density memory and/or computing applications that require high device uniformity and selectivity.

FIG. 1 is a schematic diagram illustrating a cross-sectional view of an example selector 100 in accordance with some embodiments of the present disclosure. The selector 100 may be a two-terminal device having exactly two terminals and may have a multilayer tunnel barrier structure to approximate a triangular tunnel barrier.

As shown, the selector 100 may include a first electrode 110, a multilayer barrier structure 120, and a second electrode 130. The first electrode 110 and the second electrode 130 may include a material of suitable electrical conductivity, such as graphene.

The multilayer barrier structure 120 may be fabricated on the first electrode 110. The multilayer barrier structure 120 may include multiple layers of vdW materials that form a staircase tunnel barrier that may approximate a triangular tunnel barrier. As illustrated in FIG. 1, the multilayer barrier structure 120 may include 2n+1 layers, where "1" represents a layer of a vdM material at the center of the tunnel barrier (the "central layer 121") and n is a positive integer (e.g., 1, 2, 3, . . . ) representative of the number of the layers of vdM materials between the central layer 121 and the first electrode 110 or the number of the layers between the central layer 121 and the second electrode 130.

For example, the multilayer barrier structure 120 may include a central layer 121 fabricated between the first electrode 110 and the second electrode 130. The central layer 121 may include a first vdW material. The multilayer barrier structure 120 may further include one or more layers 123 fabricated between the first electrode 110 and the central layer 121 and one or more layers 125 fabricated between the central layer 121 and the second electrode 130. As such, the central layer 121 is sandwiched between n layer(s) 123 and n layer(s) 125. Each layer 123 and/or 125 may include a vdW material that is different from the first vdW material.

The selector 100 and the multiplayer barrier structure 120 may have a staircase energy barrier that may approximate a desirable triangular energy barrier (e.g., a staircase energy barrier 700b as described in connection with FIG. 7B). The multilayer barrier structure 120 may include any suitable number of layers of vdW materials to form the staircase energy barrier. A selector with relatively more layers of vdW materials may form a staircase tunnel barrier with finer steps and may better approximate the triangular tunnel barrier than a selector with relatively fewer layers of vdW materials.

The vdW materials in various layers of the multilayer barrier structure 120 may have varying electron affinities. The electron affinity of a material may refer to the amount of energy liberated when an electron of the material is added to a neutral atom to form a negatively charged ion. As will be discussed in greater detail in connection with FIG. 4, different vdW materials may have varying electron affinities. For example, $SnS_2$, $ZrS_2$, $SnSe_2$, $HfS_2$, $MoS_2$, $MoSe_2$, $MoTe_2$, $WS_2$, $WSe_2$, graphene (Gr), and h-BN have decreasing electron affinities. The vdW material in the central layer may have the lowest electron affinity among the vdW materials in the multilayer barrier structure 120. The electron affinities of the vdM materials in the n layers positioned between the central layer 121 and the first electrode 110 may possess increasing electron affinities from the layer closest to the central layer 121 (i.e., the layer 123a) towards the layer closest to the first electrode 110 (i.e., the layer 123n). The electron affinities of the vdM materials in the n layers positioned between the central layer 121 and the second electrode 130 may possess increasing electron affinities from the layer closest to the central layer 121 (i.e., the layer 125a) towards the layer closest to the second electrode 130 (i.e., the layer 125n). The electron affinities of layers 123a-n and the electrode affinities of layer 125a-n may increase symmetrically or asymmetrically. For example, the electron affinities of the layer 123a and the layer 125a may or may not be the same. The electron affinities of the layer 123n and the layer 125n may or may not be the same.

More particularly, for example, the electron affinity of the central layer 121 is lower than the electron affinity of each layer 123 and/or 125. The electron affinity of an inner layer in the multilayer barrier structure 120 is lower than that of its adjacent outer layer, where the inner layer is closer to the central layer 121 than the outer layer. For example, the electron affinity of the layer 123a is lower than that of the layer 123b. The electron affinity of the layer 123n-1 is lower than that of the layer 123n. As another example, the electron affinity of the layer 125a is lower than that of the layer 125b. The electron affinity of the layer 125n-1 is lower than that of the layer 125n.

The multilayer barrier structure 120 may include one or more of multilayer barrier structures 120a, 120b, and 120c as described in connection with FIGS. 2A-2C below.

As will be described in greater detail in connection with FIG. 5, the selector 100 may be in a high-resistance state (an OFF state) when the voltages applied to the selector 100 is below one-half of a threshold voltage V (+V/2 or -V/2). When the voltage applied to the selector 100 reaches or exceeds the threshold voltage V, the selector 100 is conductive and in an ON state.

Figure 2A:
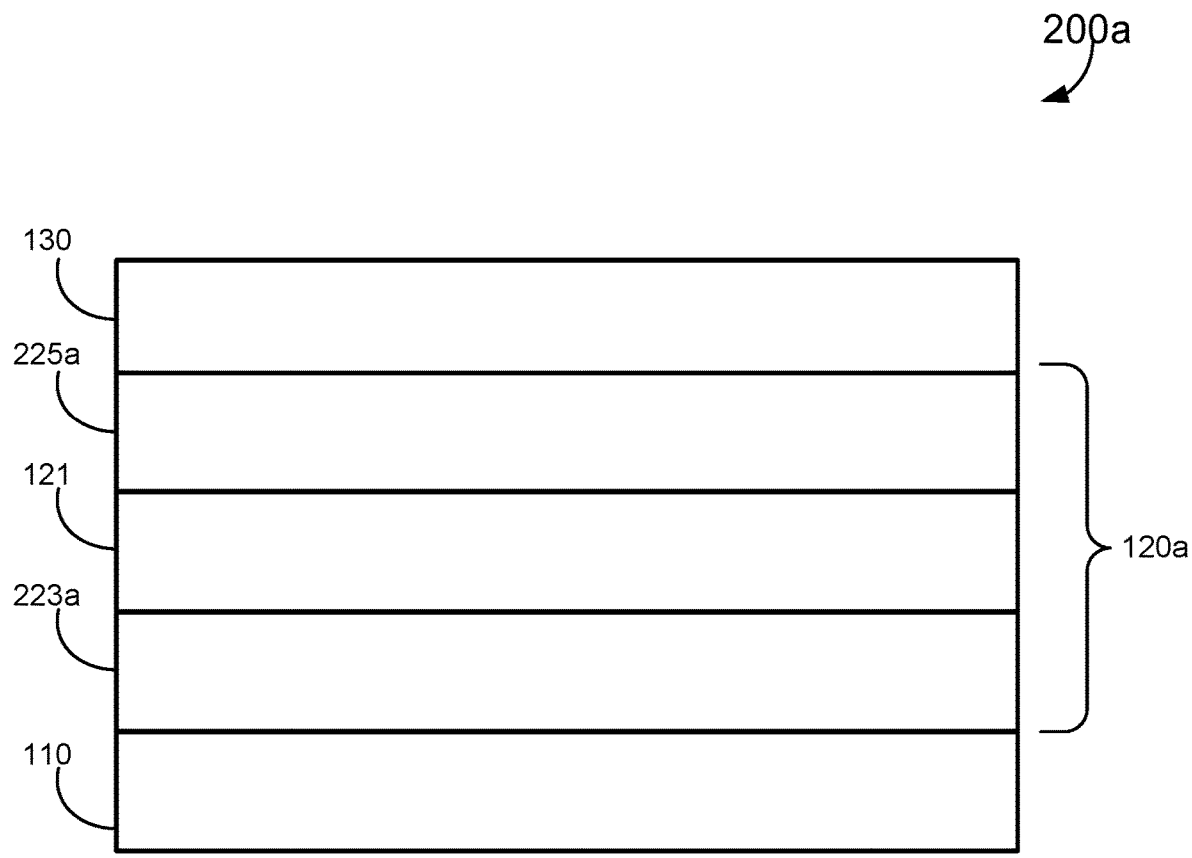
FIGS. 2A, 2B, and 2C are schematic diagrams illustrating cross-sectional views of example selectors in accordance with some embodiments of the present disclosure.
Figure 2B:
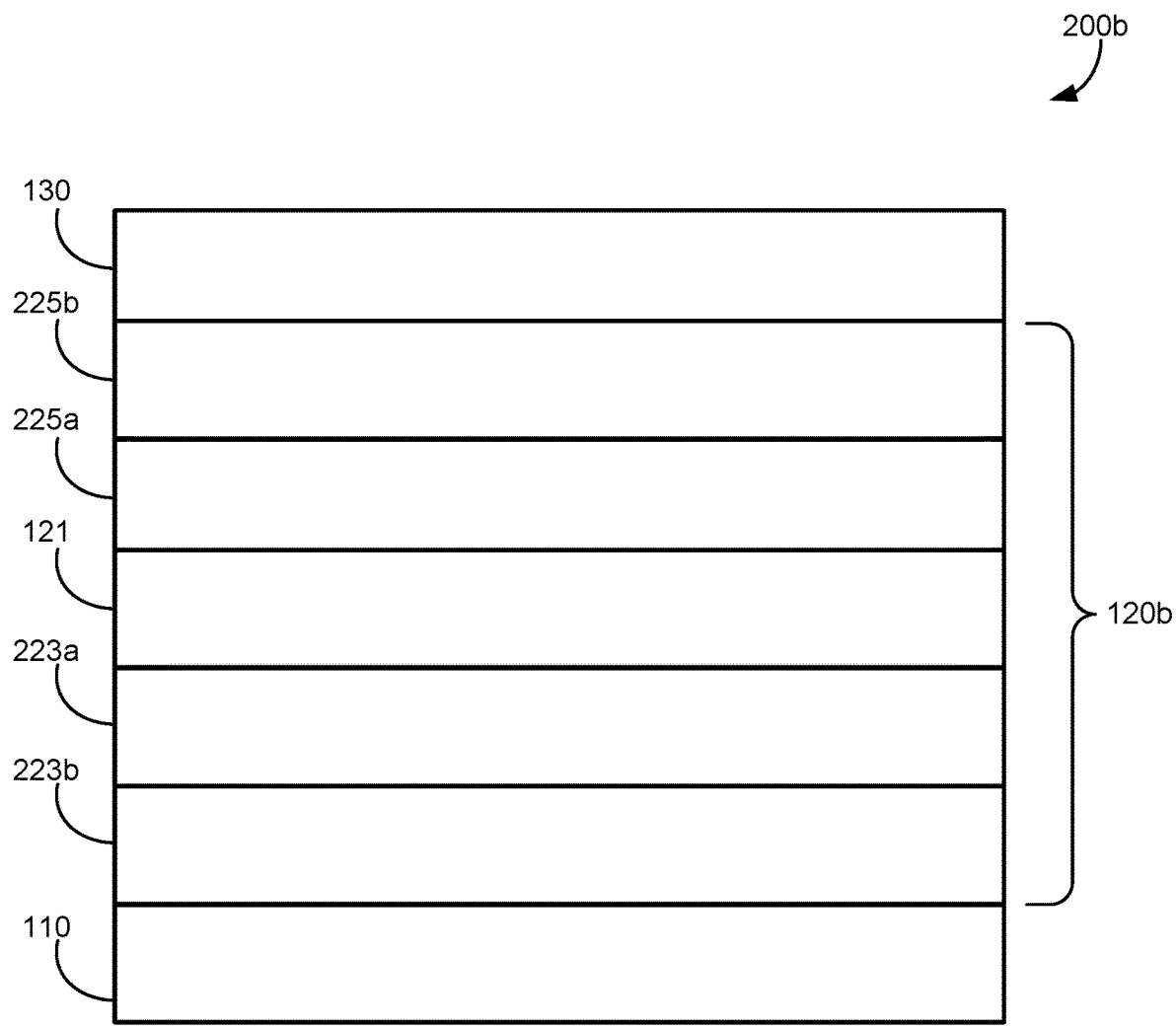
Figure 2C:
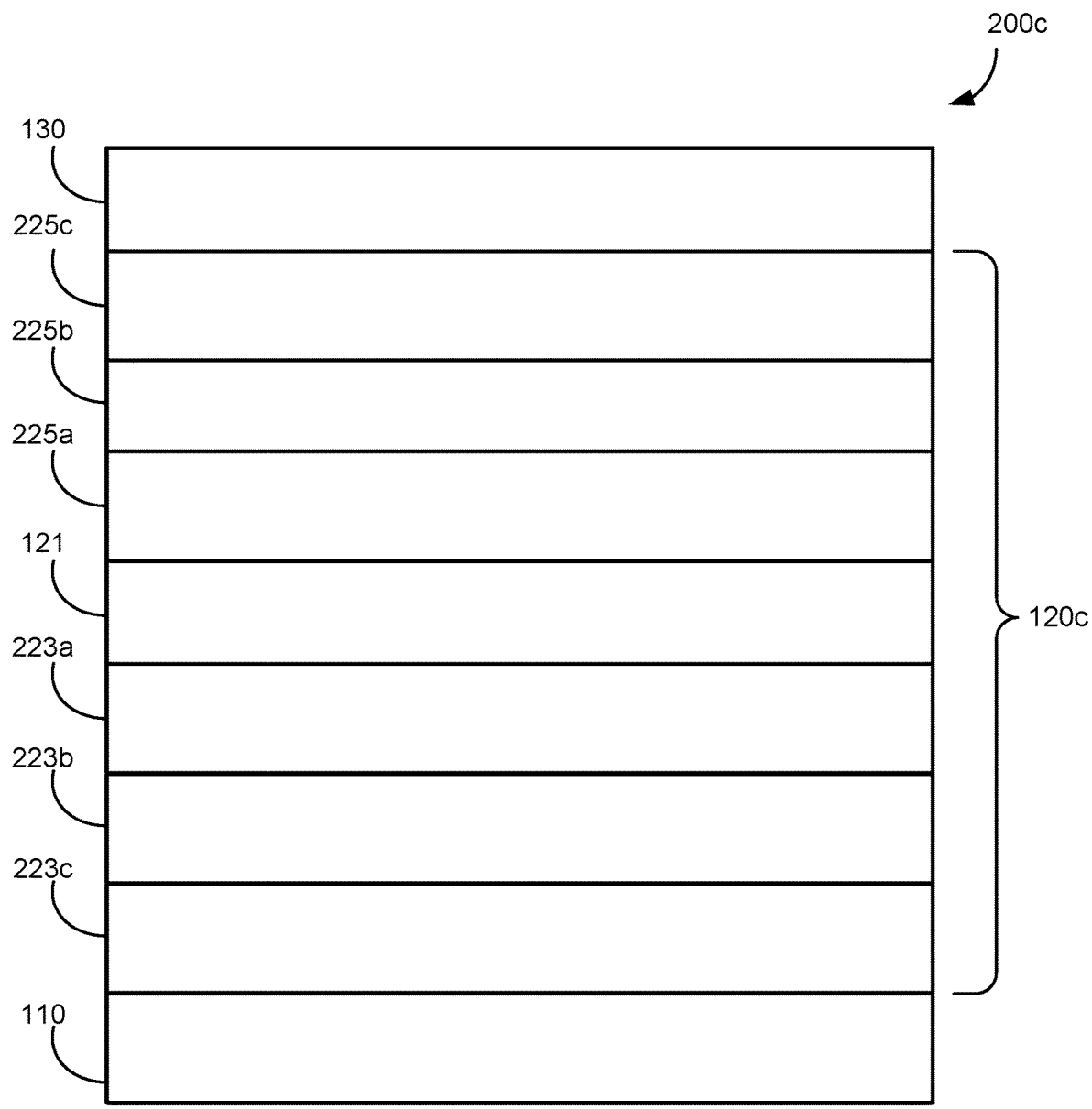

FIGS. 2A-2C are schematic diagrams illustrating cross-sectional views of examples 200a, 200b, and 200c of a selector in accordance with some embodiments of the present disclosure.

As shown in FIG. 2A, the selector 200a may include the first electrode 110 and the second electrode 130 as described in connection with FIG. 2. The selector 200a may further include a multilayer barrier structure 120a including a plurality of layers of vdW materials, as an example of 2n+1 multilayer barrier structure with n=1.

The multilayer barrier structure 120a may include a central layer 121 of a first vdW material (also referred to as the "first layer of the first vdW material"), a second layer 223a of a second vdW material, and a third layer 225a of a third vdW material. The electron affinity of the central layer 121 and/or the first vdW material (also referred to as the "first electron affinity") is lower than the electron affinity of the second layer 223 and/or the second vdW material (also referred to as the "second electron affinity") and the electron affinity of the third layer 225 and/or the third vdW material (also referred to as the "third electron affinity"). As an example, the first vdW material may be h-BN. The second material and the third material may be and/or include any suitable vdW material having an electron affinity greater than the first electron affinity, such as $MoS_2$, $WS_2$, $WSe_2$, etc. In one implementation, the central layer 121, the second layer 223a, and the third layer 225a may be a layer of h-BN, a layer of $MoS_2$, and a layer of $MoS_2$, respectively. In another implementation, the central layer 121, the second layer 223a, and the third layer 225a may be a layer of h-BN, a layer of $WS_2$, and a layer of $WS_2$, respectively. In another implementation, the central layer 121, the second layer 223a, and the third layer 225a may be a layer of h-BN, a layer of $WSe_2$, and a layer of $WSe_2$, respectively.

As another example, the first vdW material may be $WSe_2$. The second VDW material and the third vdW material may be any suitable vdW material with an electron affinity that is greater than the electron affinity of $WSe_2$. As a more particular example, the central layer 121, the second layer 223a, and the third layer 225a may include and/or be a layer of $WSe_2$, a layer of $MoSe_2$, and a layer of $MoSe_2$, respectively.

As shown in FIG. 2B, the selector 200b may include the first electrode 110 and the second electrode 130 as described in connection with FIG. 1. The selector 200b may further include a multilayer barrier structure 120b including a plurality of layers of vdW materials. The multilayer barrier structure 120n is an example of 2n+1 multilayer barrier structure with n=2.

The multilayer barrier structure 120b may include the first layer 121 including the first vdW material, the second layer 223a of the second vdW material, and the third layer 225a of the third vdW material. The multilayer barrier structure 120b may further include a fourth layer 223b of a fourth vdW material fabricated between the second layer 223a of the second vdW material and the first electrode 110. The multilayer barrier structure 120b may further include a fifth layer 225b of a fifth vdW material fabricated between the third layer 225a of the third vdW material and the second electrode 130. The electron affinity of the second vdW material (the second electron affinity) is lower than the electron affinity of the fourth vdW material (also referred to as the "fourth electron affinity"). The electron affinity of the third vdW material (the third electron affinity) is lower than the electron affinity of the fifth vdW material (also referred to as the "fifth electron affinity"). As an example, the first vdW material may be h-BN. The second vdW material and the third material may be $WSe_2$. The fourth vdW material and the fifth vdW material may be $MoS_2$. As another example, the first vdW material may be $WSe_2$. The second vdW material and the third vdW material may be $MoSe_2$. The fourth vdW material and the fifth vdW material may be $MoS_2$.

Referring to FIG. 2C, the selector 200c may include the first electrode 110 and the second electrode 130 as described in connection with FIG. 1. The selector 200c may further include a multilayer barrier structure 120c including a plurality of layers of vdW materials. The multilayer structure 120c is an example of 2n+1 multilayer barrier structure with n=3. The multilayer barrier structure 120c may include the layers 121, 223a, 223b, 225a, and 225b as described in connection with FIG. 2B above. The multilayer barrier structure 120c may further include a sixth layer 223c of a sixth vdW material and a seventh layer 225c of a seventh vdW material. The sixth layer 223c is fabricated between the fourth layer 223b and the first electrode 110. The seventh layer 225c is fabricated between the fifth layer 225b and the second electrode 130. The electron affinity of the fourth vdW material (the fourth electron affinity) is lower than the electron affinity of the sixth vdW material (also referred to as the "sixth electron affinity"). The electron affinity of the fifth vdW material (the fifth electron affinity) is lower than the electron affinity of the seventh vdW material (also referred to as the "seventh electron affinity"). For example, the first vdW material may be $WSe_2$. The second vdW material and the third vdW material may be $MoSe_2$. The fourth vdW material and the fifth vdW material may be $MoS_2$. The sixth vdW material and the seventh vdW material may be $HfS_2$.

Figure 3A:
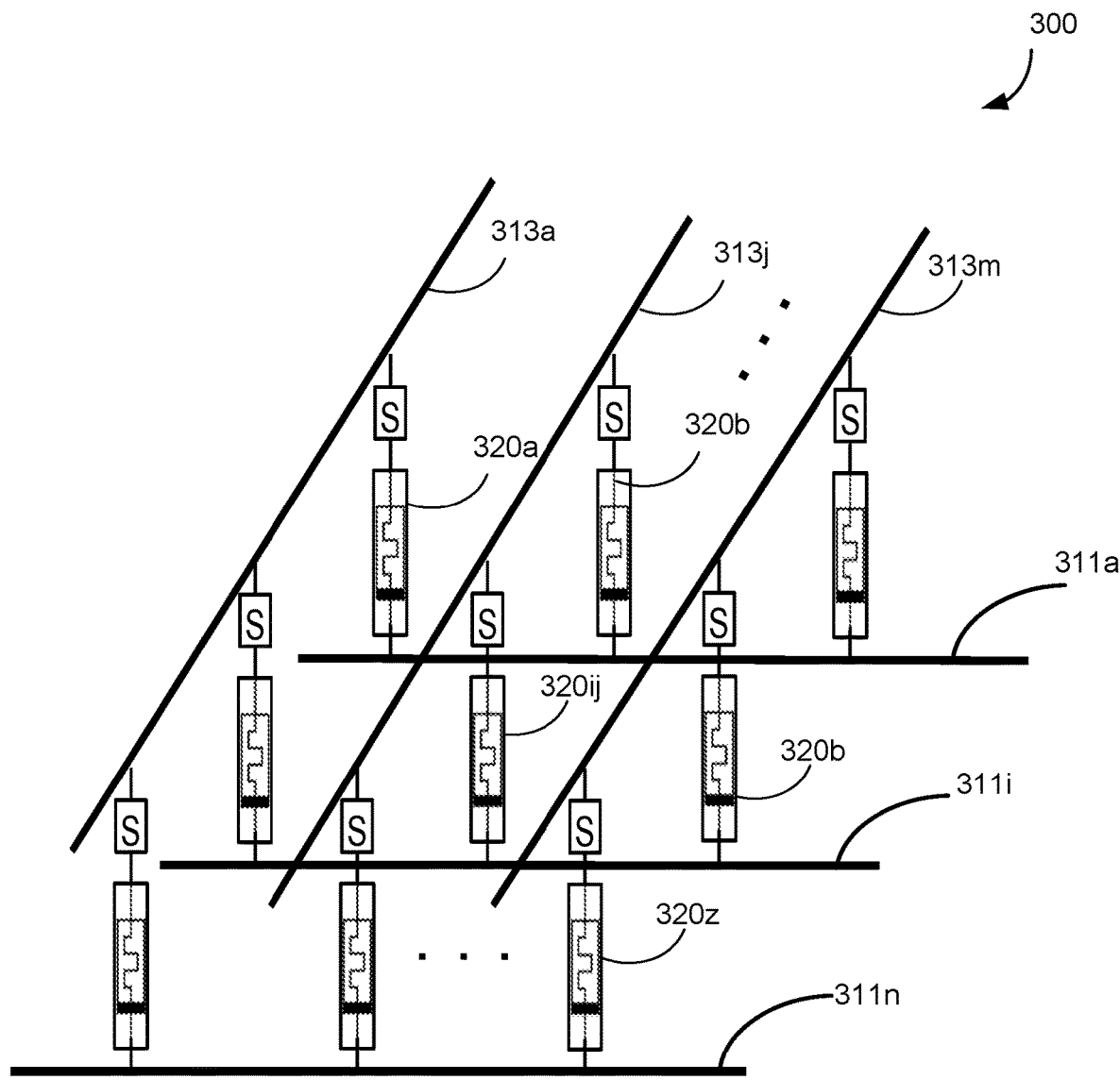
FIG. 3A is a schematic diagram illustrating an example of a crossbar circuit in accordance some embodiments of the present disclosure.

FIG. 3A is a schematic diagram illustrating an example 300 of a crossbar circuit in accordance with some embodiments of the present disclosure. As shown, crossbar circuit 300 may include a plurality of interconnecting electrically conductive wires, such as one or more bit lines 311a, ..., 311i, ..., 311n, and word lines 313a, ..., 313j, ..., 313m for an n-row by m-column crossbar array. The crossbar circuit 300 may further include cross-point devices 320a, 320b, ..., 320z, etc. Each of the cross-point devices may be connected to a bit line and a word line. For example, the cross-point device 320ij may connect the bit line 311i and the word line 313j.

In some embodiments, crossbar circuit 300 may further include digital to analog converters (DAC, not shown), analog to digital converters (ADC, not shown), switches (not shown), and/or any other suitable circuit components for implementing a crossbar-based apparatus. The number of the word lines 313a-m and the number of the bit lines 311a-n may or may not be the same.

Bit lines 311 may include a first bit line 311a, a second bit line 311i, ..., and a n-th bit line 311n. Each of bit lines 311a, ..., 311n may be and/or include any suitable electrically conductive material. In some embodiments, each bit line 311a-n may be a metal wire.

Word lines 313 may include a first word line 313a, a second word line 313j, ..., and a m-th word line 313m. Each of word lines 313a-m may be and/or include any suitable electrically conductive material. In some embodiments, each word line 313a-m may be a metal wire.

Each cross-point device 320 may be and/or include a selector and one or more memory devices, such as a memristor, resistive random-access memory (RRAM), phase-change memory (PCM), floating gates, spintronic devices, dynamic random-access memory (DRAM), ferroelectric random-access memory (FeRAM), static random-access memory (SRAM), etc. Each of the cross-point device 320 may include one or more components as described in connection with FIG. 3B below. In some embodiments, one or more of the cross-point devices 320 may include a selector serially connected to a plurality of memristor devices (also referred to as a 1SnR structure).

One or more of the cross-point devices 320 may be selected to perform an operation (e.g., a read operation, a write operation, etc.). For example, to select the cross-point device 320ij, a suitable programming voltage equivalent to the selector threshold voltage V may be applied to the cross-point device 320ij. More particularly, for example, a voltage of +V/2 and a voltage of −V/2 may be applied to the selected word line 313j and the selected bit line 311i, respectively. Therefore, the voltage across the cross-point device 320ij is a full voltage V. The cross-point device is thus turned to an ON state. The other cross-point devices that are connected to the word line 313j and the other cross-point devices that are connected to the bit line 311i are regarded as being half-selected devices, as each of these devices is subject to either the voltage of +V/2 or the voltage of −V/2. The half-selected devices may remain in an OFF state. The cross-point devices that are neither connected to the word line 313j nor the bit line 313i are unselected devices and may also remain in an OFF state. The ON/OFF states of the cross-point device are consistent with the ON/OFF states of the selector. That is, the cross-point device and the selector are in the ON state when the voltage applied to the selector is higher than the threshold voltage V and the cross-point device and the selector are Off when the voltage applied to the selector is lower than half of the threshold voltage +V/2 or -V/2. In a 1S1R configuration in which one selector device is serially connected to one memory device, the selector's resistance in the OFF state is much higher than that of the memory device. Therefore, according to the voltage division rule, the selector produces a voltage drop that is significantly greater than the voltage drop produced by the memory device. The voltage applied to the crossing-device will drop across the selector to turn the selector to the ON state. Once the selector is turned ON (e.g., being conductive), the voltage applied to the cross-point device will drop across the memory device for operations of the memory device, according to the voltage division rule. When the selector is turned ON, the memory device connected to the selector is selected. As will be discussed in greater detail below, the memory device may be electrically switched between a high-resistance state (HRS) and a low-resistance state (LRS) by applying suitable programming signals to the memory device. As such, the memory device may have ON/OFF states or memory states that are independent of the ON/OFF states of the cross-point devices.

Crossbar circuit 300 may perform parallel weighted voltage multiplication and current summation. For example, an input voltage signal may be applied to one or more rows of crossbar circuit 300 (e.g., one or more selected rows). The input signal may flow through the cross-point devices of the rows of the crossbar circuit 300. The conductance of the cross-point device may be tuned to a specific value (also referred to as a "weight"). By Ohm's law, the input voltage multiplied by the cross-point conductance generates a current from the cross-point device. By Kirchhoff's law, the summation of the current passing the devices on each column generates the current as the output signal, which may be read from the columns (e.g., outputs of the ADCs). According to Ohm's law and Kirchhoff's current law, the input-output relationship of the crossbar array can be represented as I=VG, wherein I represents the output signal matrix as current; V represents the input signal matrix as voltage; and G represents the conductance matrix of the cross-point devices. As such, the input signal is weighted at each of the cross-point devices by its conductance according to Ohm's law. The weighted current is outputted via each word line and may be accumulated according to Kirchhoff's current law. This may enable in-memory computing (IMC) via parallel multiplications and summations performed in the crossbar arrays.

Figure 3B:
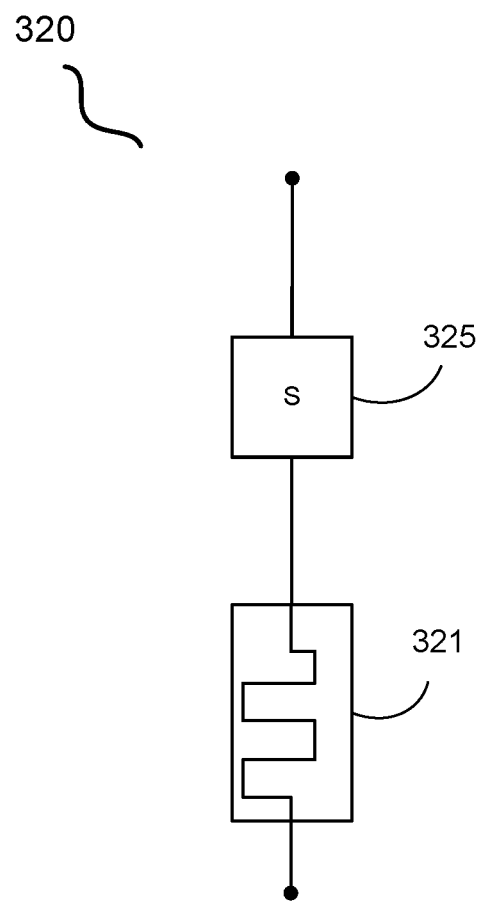
FIG. 3B is a schematic diagram illustrating an example cross-point device in accordance with some embodiments of the present disclosure.

FIG. 3B is a schematic diagram illustrating an example 320 of a cross-point device in accordance with some embodiments of the present disclosure. As illustrated, cross-point device 320 may include a memory device 321 and a selector 325 that is serially connected to the memory device 321.

The memory device 321 may include a switching oxide layer fabricated between a top electrode and a bottom electrode. The switching oxide layer may include one or more transition metal oxides, such as at least one of $HfO_x$ or $TaO_x$, wherein x may be used to indicate the oxide being oxygen deficient compared to its full (or terminal) oxide and the value of x may be varied from the oxygen to metal atomic ratio in the stoichiometry of its full oxide, such as x≤2.0 for HfOx (where $HfO_2$ being the full oxide), and x≤2.5 for $TaO_x$ (where $Ta_2O_5$ being the full oxide). In some embodiments, as will be described in greater detail in connection with FIGS. 8A and 8B, the memory device 321 and the selector 325 may be stacked vertically so that the memory device 321 and the selector 325 may share the same electrode as the top electrode of one device and the bottom electrode of the other device.

The resistance of the memory device 321 may be electrically switched between a high-resistance state (HRS) and a low-resistance state (LRS) by applying suitable programming signals to the RRAM device. For example, the RRAM device may be in an initial state or virgin state and may have an initial high resistance before it is subject to an electrical simulation (e.g., a voltage or current signal applied to the RRAM device). The memory device 321 may be tuned to a lower resistance state from the virgin state via a forming process or from a HRS to a LRS via a setting process. The forming process may refer to programming a device starting from the virgin state. The setting process may refer to programming a device starting from the HRS.

The selector 325 may be and/or include the selector 100, 200a, 200b, and/or 200c as described in connection with FIGS. 1-2C above. The selector 325 is a two-terminal device that may act as a bipolar switch to control currents across the memory device 321. The current that passes through the selector varies non-linearly with the voltage applied to the selector. The selector 325 may be in a high-resistance state when the voltages applied to the selector 325 is below one-half of the threshold voltage (+V/2 or -V/2). When the voltage applied to the selector 325 reaches or exceeds the threshold voltage V, the selector 325 is conductive, and the memory device 321 connected to the selector is selected to operate. A suitable programming voltage (a voltage equal to greater than the threshold voltage) may be applied to the cross-point device 320 to program the memory device 321 to a desirable conductance.

Figure 4:
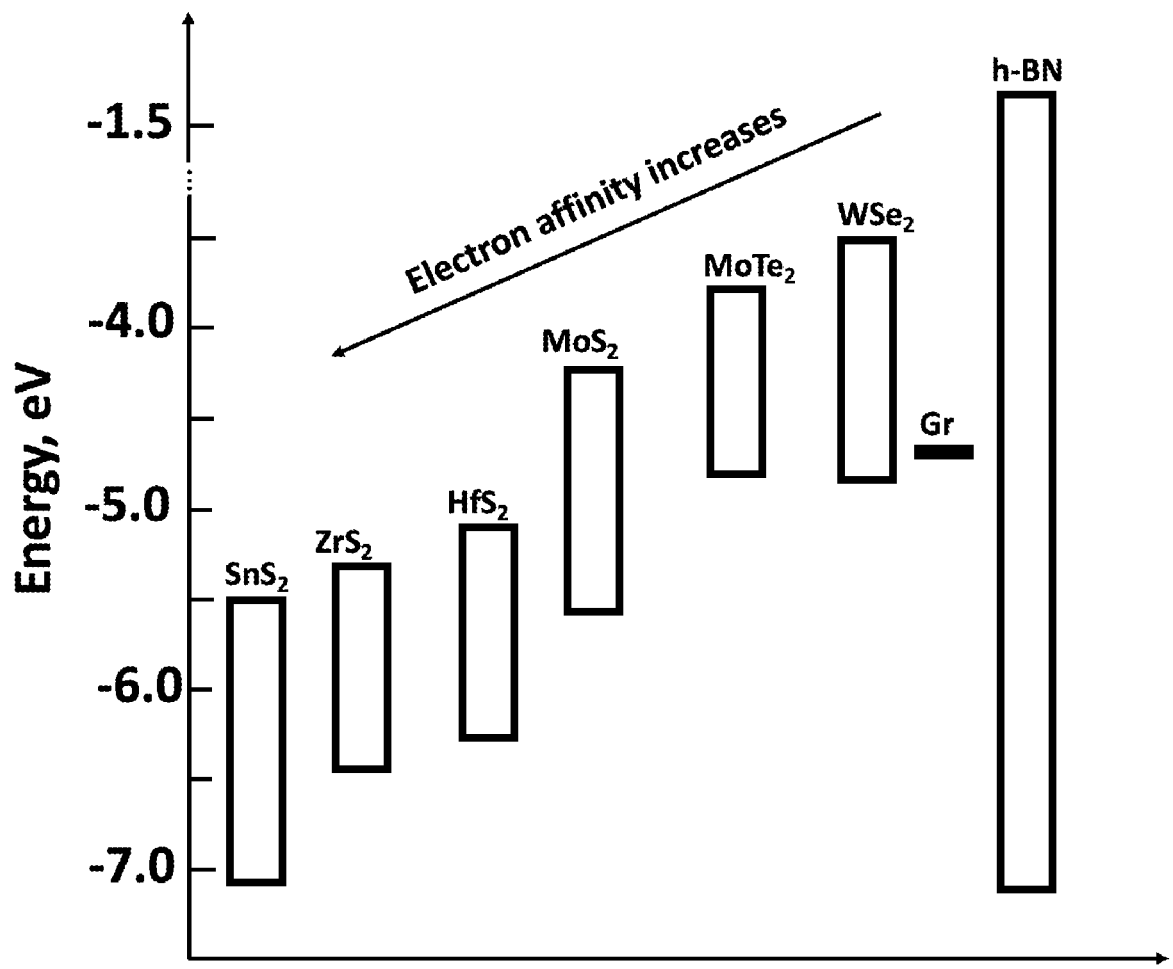
FIG. 4 is a diagram illustrating bandgaps and electron affinities of example van der Waals materials in accordance with some embodiments of the present disclosure.

FIG. 4 is a diagram illustrating bandgaps and electron affinities of example vdW materials in accordance with some embodiments of the present disclosure. As shown, each vdW material is associated with a particular energy band Eg (where the rectangular bars represent the band gaps of the selected vdW materials corresponding to the difference between the lowest energy of the conduction band ($E_C$) and the highest energy of the valence band ($E_V$)). Different vdW materials may have varying electron affinities as shown in FIG. 4. For example, as shown in FIG. 4, $SnS_2$, $ZrS_2$, $HfS_2$, $MoS_2$, $MoTe_2$, $WSe_2$, graphene (Gr), and h-BN have decreasing electron affinities.

Figure 5:
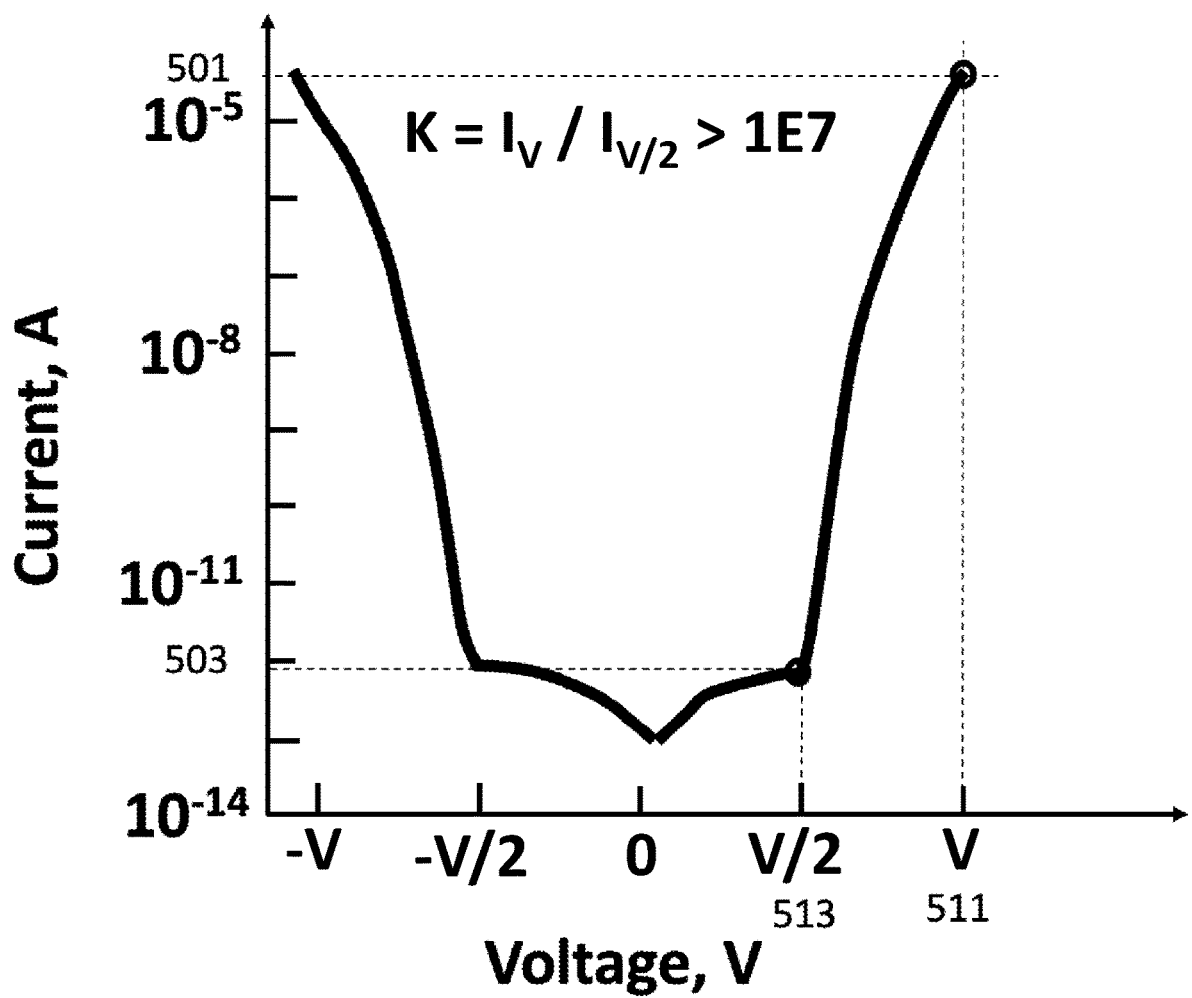
FIG. 5 is a diagram illustrating current-voltage (I-V) characteristics of a selector in accordance with some embodiments of the present disclosure.
Figure 6:
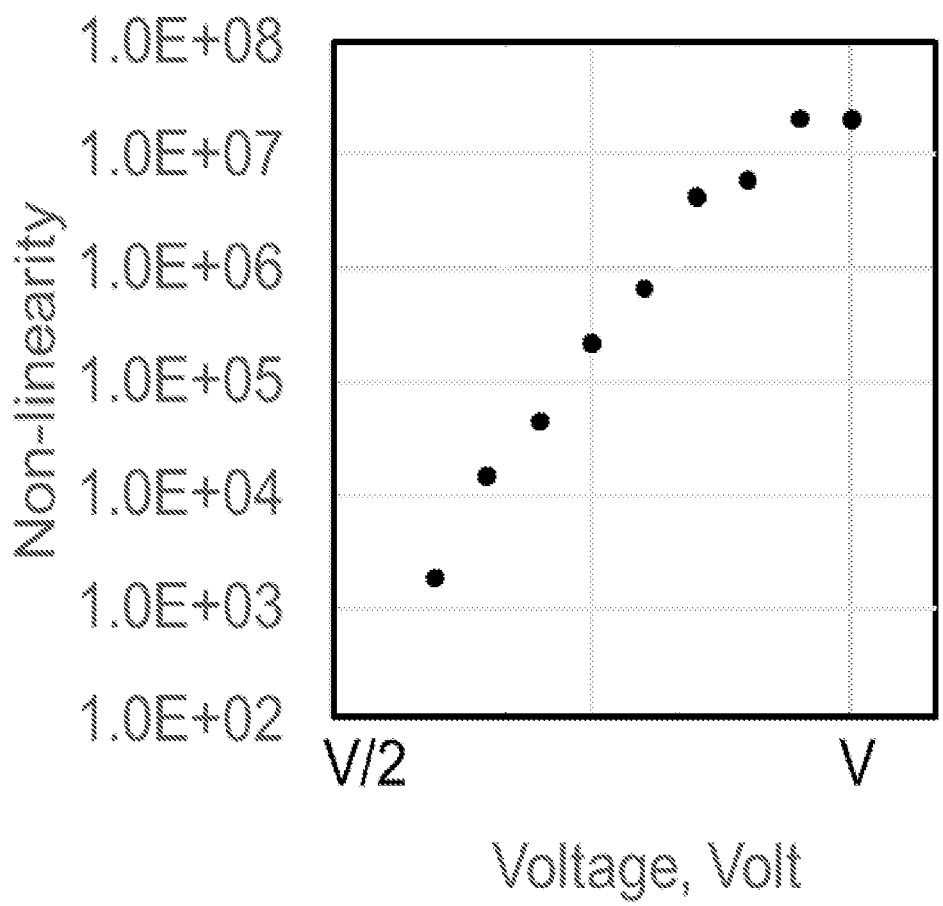
FIG. 6 is a diagram illustrating nonlinearity of a selector in accordance with some embodiments of the present disclosure.

FIG. 5 is a diagram illustrating current-voltage (I-V) characteristics of a selector in accordance with some embodiments of the present disclosure. As shown, the selector exhibits current-voltage nonlinearity. That is, the current that passes through the selector varies non-linearly with the voltage applied to the selector. The nonlinearity of the selector may be measured by a nonlinearity factor K corresponding to a ratio of the current at a full voltage V (e.g., a current 501 corresponding to a voltage 511 as shown in FIG. 5) to the current at a half of the full-voltage V/2 (e.g., a current 503 corresponding to a voltage 513 as shown in FIG. 5). The full voltage V may be a threshold voltage that may switch the selector to a conductive state. That is, when the voltage applied to the selector reaches or exceeded the full voltage V, the selector is conductive, and a memory or computing cell controlled by the selector is selected. As shown in FIG. 6, the value of K may be about or greater than $10^7$. As such, the selector disclosed herein exhibit high nonlinearity.

FIG. 6 is a diagram illustrating nonlinearity of a selector in accordance with some embodiments of the present disclosure. As shown, the nonlinearity factor K of the selector may be greater than $10^7$. The value of K may also be greater than $10^2$, $10^5$, etc. for various applications. Accordingly, the selector possesses desirable high nonlinearity.

Figure 7A:
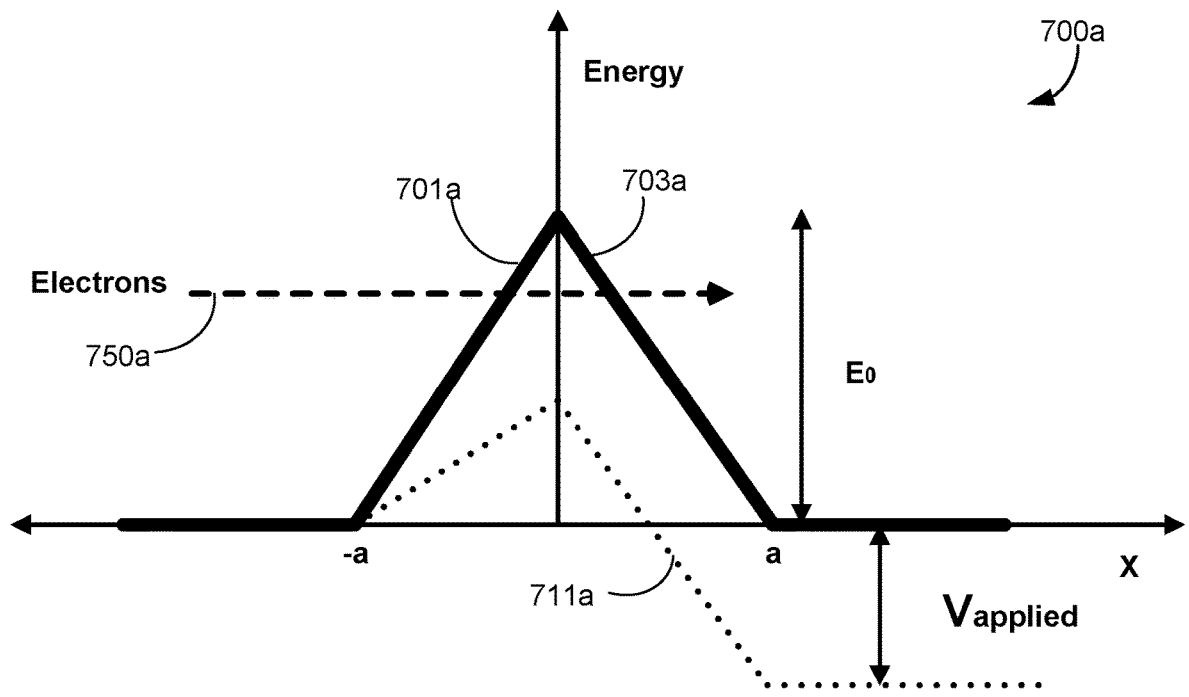
FIGS. 7A and 7B are diagrams illustrating example energy barriers in accordance with some embodiments of the present disclosure.

FIG. 7A is a band diagram of an example tunnel barrier 700a of a selector in accordance with some embodiments of the present disclosure. The energy barrier 700a is in a triangular shape defined by symmetric lines 701a and 703a with a barrier height of $E_0$ at the center of the barrier. The tunnel barrier 700a is also referred to as a triangular tunnel barrier. The total width of the barrier is 2a (from -a to +a on X-axis). Without an external voltage $V_{applied}$, electrons with energies lower than $E_0$ (represented by the arrow 750a) need to tunnel through the energy barrier. As such, the current passing through the selector is low and the selector is in an OFF state. With an external voltage $V_{applied}$ being applied across the selector, the energy barrier is lowered as shown by the dotted lines 711a. The electrons represented by the arrow 750a can move freely across the barrier. As such, the current passing through the selector is high, and the selector is in an ON state (a conductive state).

Figure 7B:
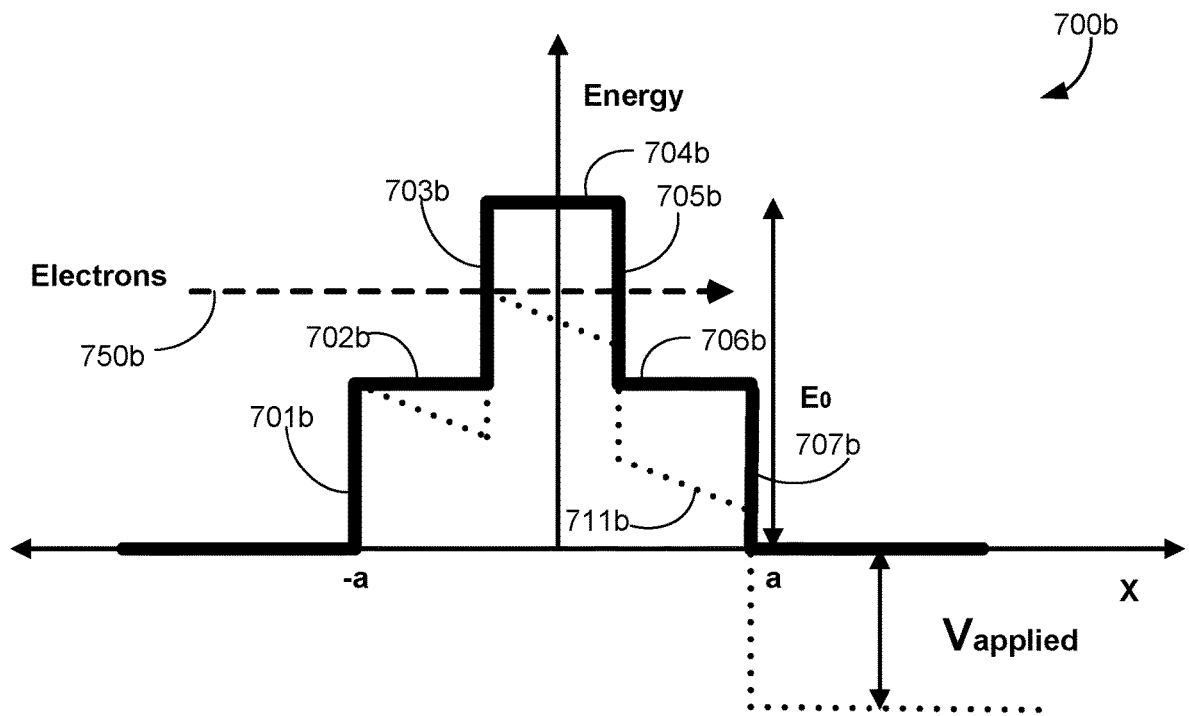

FIG. 7B is a band diagram of an example energy barrier 700b of a selector in accordance with some embodiments of the present disclosure. The energy barrier 700b is also referred to as a staircase energy barrier and can approximate the triangular tunnel barrier 700a of FIG. 7A. As shown, the energy barrier 700b is in a staircase shape defined by lines 701b, 702b, 703b, 704b, 705b, 706b, and 707b with a barrier height of $E_0$ at the center of the barrier. The total width of the barrier is 2a (from -a to +a on X-axis). This could be an example of 2n+1 layers with n=1 as shown in FIG. 2A with a center layer 121 sandwiched between a layer 223a and a layer 225a. While the energy barrier 700b is symmetric with respect to the Y-axis representative energy, this is merely illustrative. In some embodiments, the energy barrier 700 is not symmetric with respect to the Y-axis.

Without an external voltage $V_{applied}$, electrons with energies lower than $E_0$ (represented by the arrow 750b) need to tunnel through the energy barrier. As such, the current passing through the selector is low and the selector is in an OFF state. With an external voltage $V_{applied}$ being applied across the selector, the energy barrier is lowered as shown in the dotted lines 711b. The electrons represented by the arrow 750b can move freely across the barrier. As such, the current passing through the selector is high and the selector is in an ON state (a conductive state). A selector with more layers of vdW materials may have a staircase energy barrier with finer steps and may thus better approximate the triangular tunnel barrier 700a than a selector with relatively fewer layers of vdW materials.

Figure 8A:
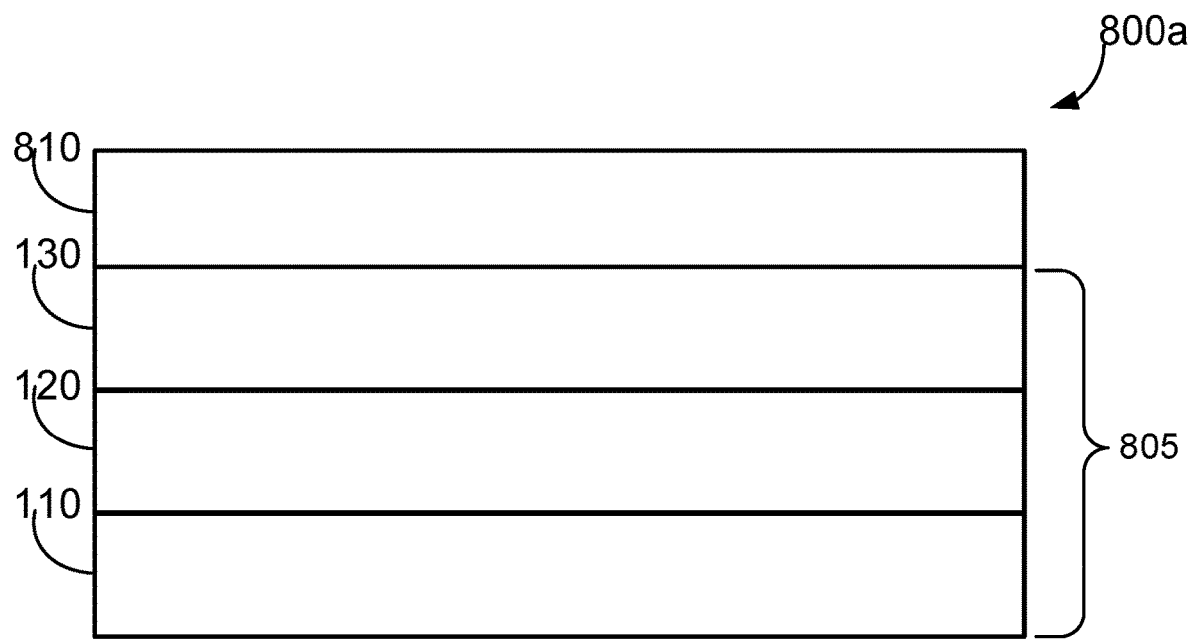
FIGS. 8A and 8B are schematic diagrams illustrating cross-sectional views of example 1S1R structures in accordance with some embodiments of the present disclosure.
Figure 8B:
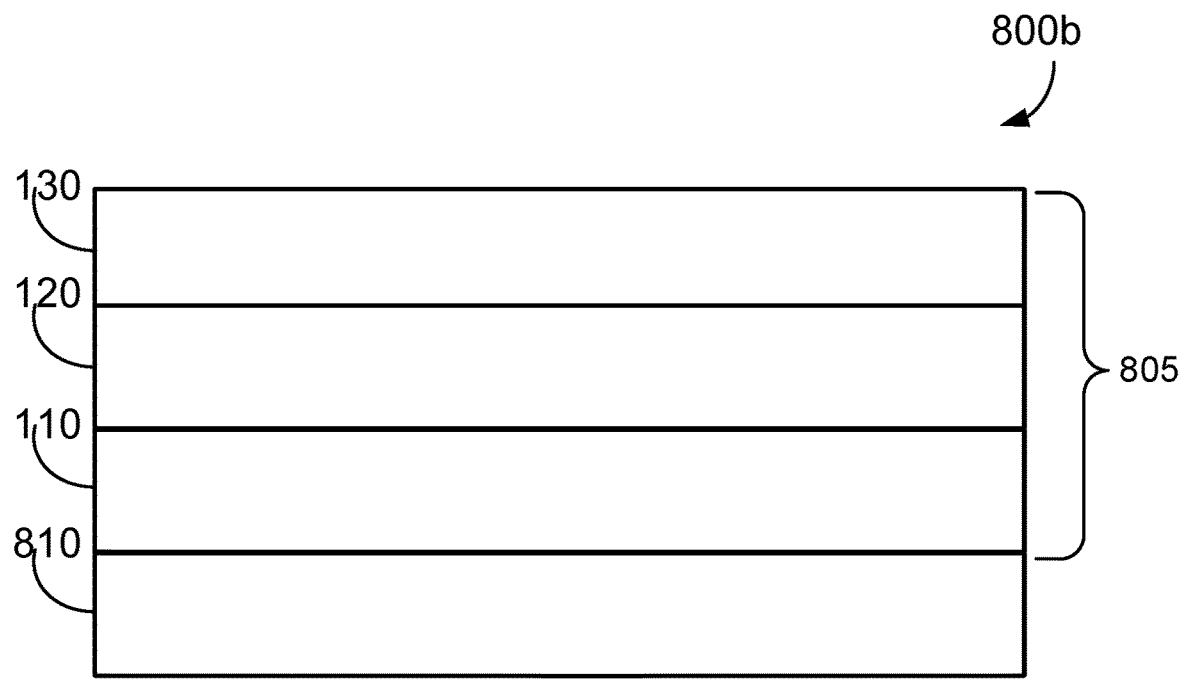

FIGS. 8A and 8B are schematic diagrams illustrating cross-sectional views of example 1S1R structures in accordance with some embodiments of the present disclosure.

As shown in FIG. 8A, 1S1R structure 800a may include a first electrode 110, a multilayer barrier structure 120 fabricated on the first electrode 110, a second electrode 130 fabricated on the multilayer barrier structure 120 to complete a selector 805. A memory device 810 may be fabricated on the second electrode 130 of the selector 805. The memory device 810 may have its own device stack including a bottom electrode, switching oxides, and a top electrode, etc. In some embodiments, the memory device 810 may share one or more electrodes with the selector 805 (e.g., by using the second electrode 130 as its bottom electrode). The first electrode 110, the multilayer barrier structure 120, and the second electrode 130 may correspond to their counterparts as described in connection with FIGS. 1-2C above. In this implementation, the memory device 810 is fabricated over the second electrode 130 of the selector 805.

The memory device 810 may be and/or include any suitable with programmable conductance, such as a memristor, RRAM, PCM, floating gates, spintronic devices, DRAM, FeRAM, SRAM, etc. In some embodiments, the memory device 810 may include a switching oxide layer including one or more transition metal oxides, such as $HfO_x$, $TaO_x$, $TiO_x$, $NbO_x$, $ZrO_x$, etc. In some embodiments, the switching oxide layer includes at least one of $HfO_x$ or $TaO_x$, wherein x may be used to indicate the oxide being oxygen deficient compared to its full (or terminal) oxide and the value of x may be varied from the oxygen to metal atomic ratio in the stoichiometry of its full oxide, such as x≤2.0 for HfOx (where $HfO_2$ being the full oxide), and x≤2.5 for TaOx (where $Ta_2O_5$ being the full oxide).

As shown in FIG. 8B, 1S1R structure 800b may include the memory device 810 and the selector 805. In this implementation, the selector 805 is fabricated on the memory device 810. The first electrode 110, the multilayer barrier structure 120, and the second electrode 130, as described above, may be sequentially fabricated over the memory device 810. The memory device 810 may have its own device stack including a bottom electrode, switching oxides, and a top electrode, etc. The multilayer barrier structure 120 is fabricated on the first electrode 110, and the second electrode 130 is fabricated on the multilayer barrier structure 120.

While certain layers are illustrated in FIGS. 1, 2A-2C, and 8A-8B, this is merely illustrative. The selectors and the 1S1R structures described herein may include any suitable components and/or layers for implementing memory and computing applications. For example, the memory device 810 may include one or more interface layers (not shown) of one or more materials that are more chemically stable than the transition metal oxides in the switching oxide layer.

Figure 9:
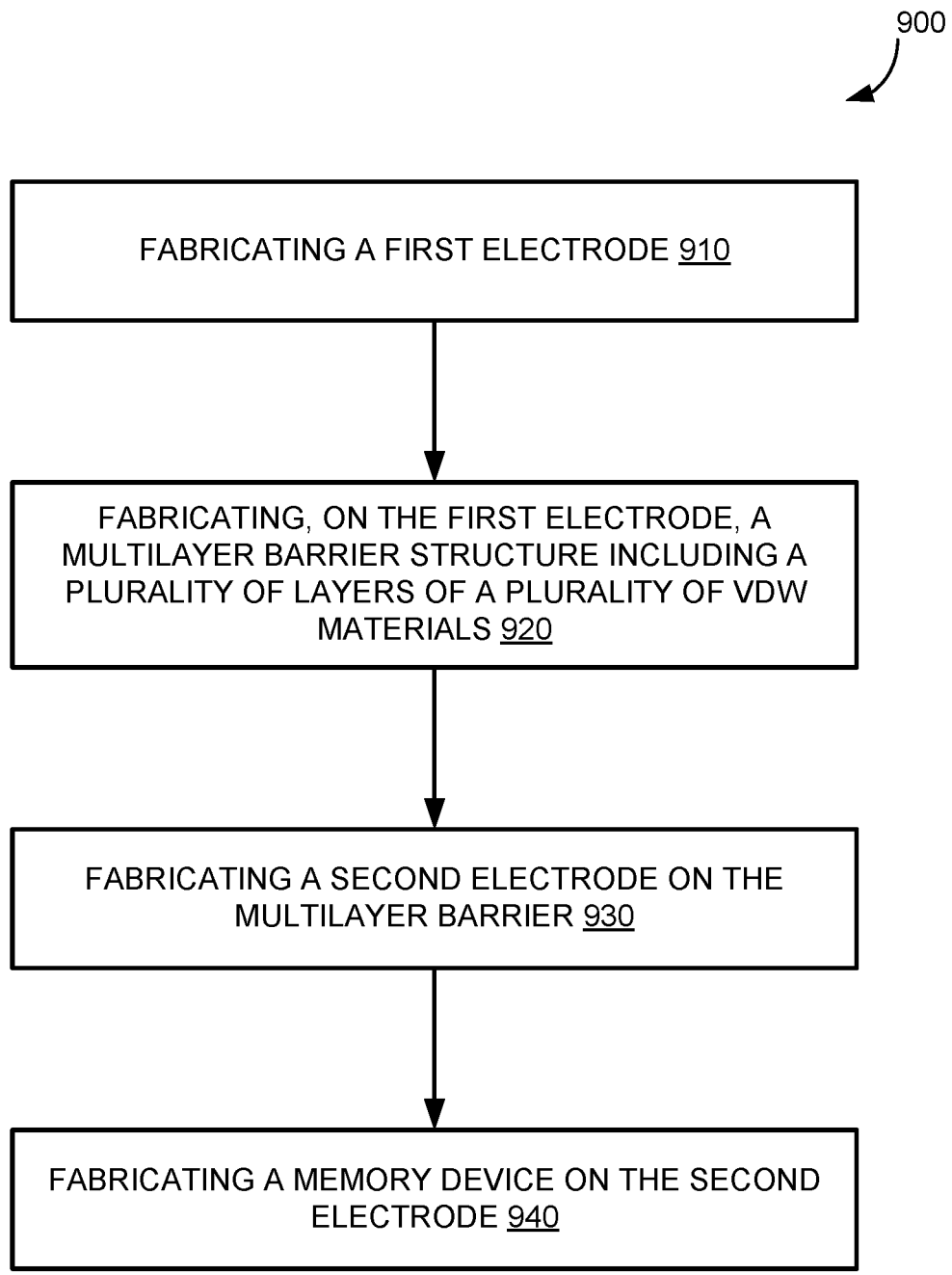
FIGS. 9 and 10 are flow diagrams illustrating example methods for fabricating a selector and an apparatus including a 1S1R structure in accordance with some embodiments of the present disclosure.

FIG. 9 is a flow diagram illustrating an example 900 of a method for fabricating a selector and/or a 1S1R structure according to some embodiments of the disclosure. The 1S1R structure may be the 1S1R structure 800a as described in connection with FIG. 8A.

At block 910, a first electrode 110 may be fabricated. The first electrode may include the second electrode 110 as described in connection with FIG. 1 above. Fabricating the first electrode may involve depositing a layer of a material of suitable electrical conductivity.

At block 920, a multilayer barrier structure may be fabricated on the first electrode. The multilayer barrier structure may include a plurality of layers of a plurality of vdW materials. The multilayer barrier structure may be and/or include the multilayer barrier structure 120, 120a, 120b, and/or 120c as described in connection with FIGS. 1-2C. Fabricating the multilayer barrier structure may include fabricating the layer 123n on the first electrode, fabricating the central layer 121, and fabricating the layer 125n. Fabricating the multilayer barrier structure may further include fabricating one or more layers 123i between layers 123a and 123n and one or more layers 123j between layers 125a and 125n. Each of the layers of vdW materials may be grown by various ultra-thin film deposition techniques, such as chemical vapor deposition (CVD), atomic layer deposition, (ALD), physical vapor deposition (PVD). In some embodiments, the multilayer barrier structure may be fabricated utilizing suitable layer transfer techniques, for example, by transferring one or more layers of vdW materials onto the first electrode and/or one or more other vdW layers of the multilayer barrier structure to fabricate the selector.

At block 930, a second electrode may be fabricated on the multilayer barrier structure. The second electrode may include the second electrode 130 as described in connection with FIG. 1 above. Fabricating the second electrode may involve depositing a layer of a material of suitable electrical conductivity on the memory device.

At block 940, a memory device may be fabricated on the second electrode of the selector device. Fabricating the memory device may involve fabricating a bottom electrode, a switching oxide layer, a top electrode, etc. The switching oxide layer may include one or more transition metal oxides, such as $TaO_x$, $HfO_x$, $TiO_x$, $NbO_x$, $ZrO_x$, etc. The switching oxide layer may be deposited utilizing PVD, CVD, ALD, and/or any other suitable deposition technique. In some embodiments, the second electrode of the selector device may be used as the bottom electrode of the memory device.

Figure 10:
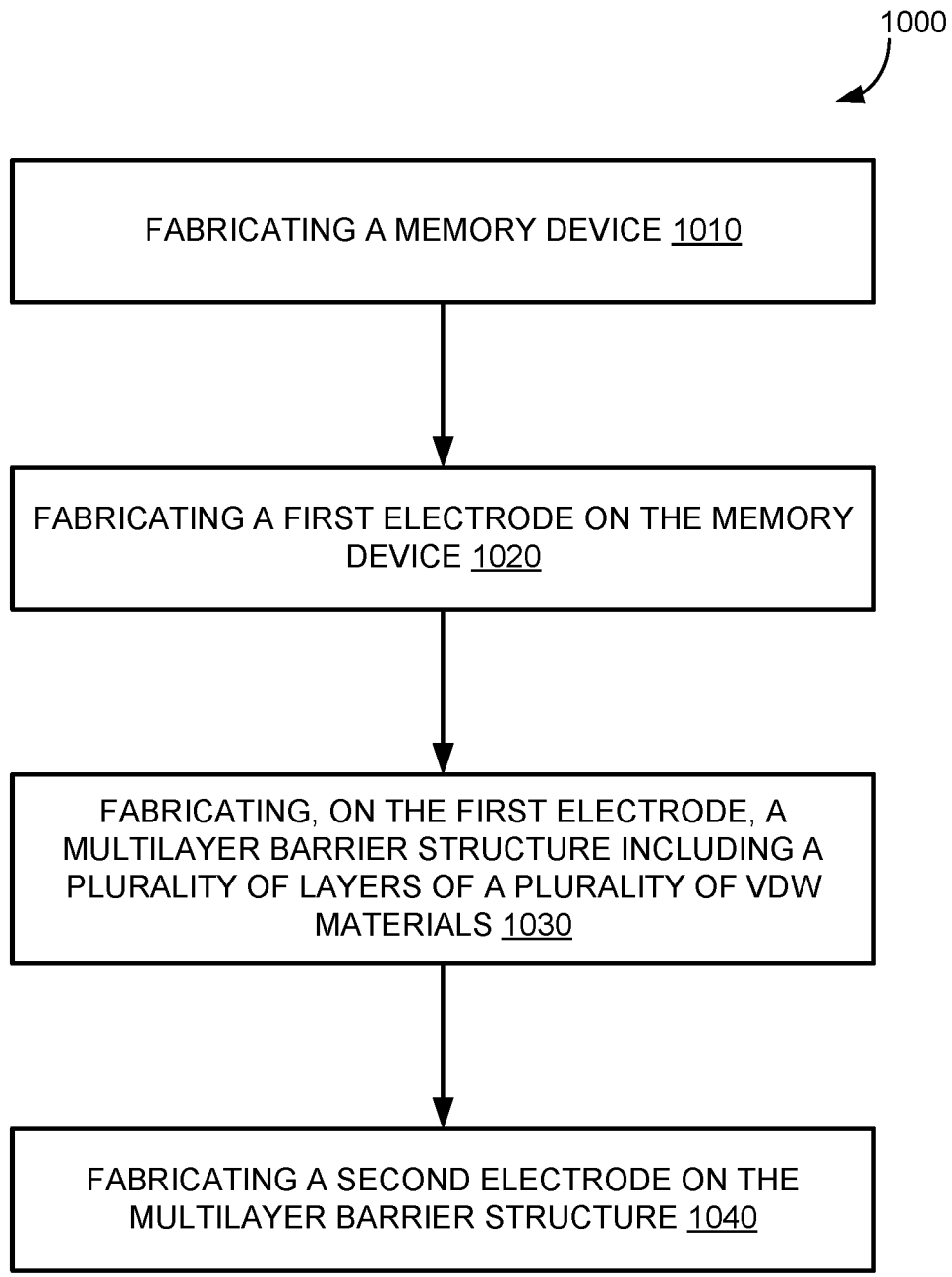

FIG. 10 is a flow diagram illustrating an example 1000 of a method for fabricating a selector and a 1S1R device according to some embodiments of the disclosure. The 1S1R structure may be the 1S1R structure 800b as described in connection with FIG. 8B.

At block 1010, a memory device may be fabricated. The memory device may be the memory device 810 as described in connection with FIG. 8B and may have its own device stack including a bottom electrode, switching oxides, a top electrode, etc. Fabricating the memory device may involve fabricating a switching oxide layer including one or more transition metal oxides, such as $TaO_x$, $HfO_x$, $TiO_x$, $NbO_x$, ZrO$_x$, etc. The switching oxide layer may be deposited utilizing PVD, CVD, ALD, and/or any other suitable deposition technique.

At block 1020, a first electrode 110 may be fabricated on the memory device 810. In some embodiment, the top electrode of the memory device 810 may also be used as the first electrode 110 of the selector device.

At block 1030, a multilayer barrier structure may be fabricated on the first electrode 110. For example, one or more operations as described in connection with block 920 of FIG. 9 may be performed to fabricate the multiplayer barrier structure.

At block 1040, a second electrode may be fabricated on the multilayer barrier structure. The second electrode may include the second electrode 130 as described in connection with FIG. 1 above. Fabricating the second electrode may involve depositing a layer of a material of suitable electrical conductivity on the memory device.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events.

The terms "approximately," "about," and "substantially" may be used to mean within ±20% of a target dimension in some embodiments, within ±10% of a target dimension in some embodiments, within ±5% of a target dimension in some embodiments, and yet within ±2% in some embodiments. The terms "approximately" and "about" may include the target dimension.

In the foregoing description, numerous details are set forth. It will be apparent, however, that the disclosure may be practiced without these specific details. In some instances, well-known structures and devices are shown in block diagram form, rather than in detail, in order to avoid obscuring the disclosure.

The terms "first," "second," "third," "fourth," etc. as used herein are meant as labels to distinguish among different elements and may not necessarily have an ordinal meaning according to their numerical designation.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Reference throughout this specification to "an implementation" or "one implementation" means that a particular feature, structure, or characteristic described in connection with the implementation is included in at least one implementation. Thus, the appearances of the phrase "an implementation" or "one implementation" in various places throughout this specification are not necessarily all referring to the same implementation.

As used herein, when an element or layer is referred to as being "on" another element or layer, the element or layer may be directly on the other element or layer, or intervening elements or layers may be present. In contrast, when an element or layer is referred to as being "directly on" another element or layer, there are no intervening elements or layers present.

Whereas many alterations and modifications of the disclosure will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the disclosure.

What is claimed is:

1. A selector, comprising:
   a multilayer barrier structure fabricated between a first electrode and a second electrode, wherein the multilayer barrier structure comprises:
   a first layer comprising a first van der Waals (vdW) material;
   a second layer comprising a second vdW material; and
   a third layer comprising a third vdW material, wherein a first electron affinity of the first layer comprising the first vdW material is lower than a second electron affinity of the second layer comprising the second vdW material and a third electron affinity of the third layer comprising the third vdW material.

2. The selector of claim 1, wherein the first layer comprising the first vdW material is fabricated between the second layer comprising the second vdW material and the third layer comprising the third vdW material.

3. The selector of claim 1, wherein the first vdW material comprises h-BN, and wherein the second vdW material comprises at least one of MoS$_2$, WS$_2$, or WSe$_2$.

4. The selector of claim 3, wherein the third vdW material comprises at least one of MoS$_2$, WS$_2$, or WSe$_2$.

5. The selector of claim 1, wherein the first vdW material comprises WSe$_2$, and wherein the second vdW material comprises at least one of MoSe$_2$, MoS$_2$, or HfS$_2$.

6. The selector of claim 1, wherein the multilayer barrier structure further comprises a fourth layer of a fourth vdW material, wherein the second electron affinity of the second vdW material is lower than a fourth electron affinity of the fourth vdW material.

7. The selector of claim 6, wherein the fourth layer of the fourth vdW material is fabricated between the second layer comprising the second vdW material and the first electrode.

8. The selector of claim 6, wherein the multilayer barrier structure further comprises a fifth layer of a fifth vdW material, wherein the third electron affinity of the third layer of the third vdW material is lower than a fifth electron affinity of the fifth layer of the fifth vdW material.

9. The selector of claim 8, wherein the fifth layer of the fifth vdW material is fabricated between the third layer comprising the third vdW material and the second electrode.

10. The selector of claim 1, wherein the multilayer barrier structure comprises 2n+1 layers of vdW materials, wherein n is a positive integer.

11. The selector of claim 1, wherein the multilayer barrier structure forms a staircase tunnel barrier approximating a triangular tunnel barrier.

12. The selector of claim 1, wherein a ratio of a first current passing through the selector responsive to a first voltage to a second current passing through the selector responsive to a second voltage is not less than $10^2$, wherein the second voltage is half of the first voltage.

13. An apparatus, comprising:
a selector comprising:
a multilayer barrier structure fabricated between a first electrode and a second electrode, wherein the multilayer barrier structure comprises:
a first layer comprising a first van der Waals (vdW) material;
a second layer comprising a second vdW material; and
a third layer comprising a third vdW material, wherein a first electron affinity of the first layer comprising the first vdW material is lower than a second electron affinity of the second layer comprising the second vdW material and a third electron affinity of the third layer comprising the third vdW material; and
a memory device serially connected to the selector.

14. The apparatus of claim 13, wherein the memory device comprises at least one of a memristor, resistive random-access memory (RRAM), phase-change memory (PCM), floating gates, spintronic devices, dynamic random-access memory (DRAM), ferroelectric random-access memory (FeRAM), or static random-access memory (SRAM).

15. The apparatus of claim 13, wherein the first vdW material comprises h-BN, and wherein the second vdW material comprises at least one of $MoS_2$, $WS_2$, or $WSe_2$.

16. The apparatus of claim 15, wherein the third vdW material comprises at least one of $MoS_2$, $WS_2$, or $WSe_2$.

17. The apparatus of claim 13, wherein the first vdW material comprises $WSe_2$, and wherein the second vdW material comprises at least one of $MoSe_2$, $MoS_2$, or $HfS_2$.

18. The apparatus of claim 13, wherein the multilayer barrier structure further comprises a fourth layer of a fourth vdW material, wherein the second electron affinity of the second vdW material is lower than a fourth electron affinity of the fourth vdW material.

19. The apparatus of claim 13, wherein the apparatus further comprises the first electrode and the second electrode.

20. The apparatus of claim 13, wherein the selector has a staircase tunnel barrier approximating a triangular tunnel barrier.

* * * * *